United States Patent [19]

Brown

[11] 4,408,161
[45] Oct. 4, 1983

[54] COMPUTER-CONTROLLED, PORTABLE SPIN ECHO NMR INSTRUMENT AND METHOD OF USE

[75] Inventor: Robert J. S. Brown, Fullerton, Calif.

[73] Assignee: Chevron Research Company, San Francisco, Calif.

[21] Appl. No.: 255,976

[22] Filed: Apr. 15, 1981

[51] Int. Cl.³ .......................................... G01R 33/08
[52] U.S. Cl. .................................. 324/303; 324/307; 324/311
[58] Field of Search ............... 324/300, 301, 303, 307, 324/311, 318, 312

[56] References Cited

U.S. PATENT DOCUMENTS

| | | | |
|---|---|---|---|
| 3,824,452 | 7/1974 | Freeman | 324/312 |
| 4,045,723 | 8/1977 | Ernst | 324/312 |
| 4,165,479 | 8/1979 | Mansfield | 324/313 |

*Primary Examiner*—Michael J. Tokar
*Attorney, Agent, or Firm*—H. D. Messner; Edward J. Keeling

[57] ABSTRACT

In accordance with the present invention, permeability estimates of a carbonate sample based on spin echo diffusion characteristics of the hydrogen nuclei of interstitial fluids within the pore space of such sample, can be swiftly and accurately achieved using a computer-controlled, portable NMR instrument. Result: Even though the instrument is placed at field sites away from the usual processing center, quick analysis of such samples as during the drilling of a well, still results.

17 Claims, 4 Drawing Figures

FIG_1

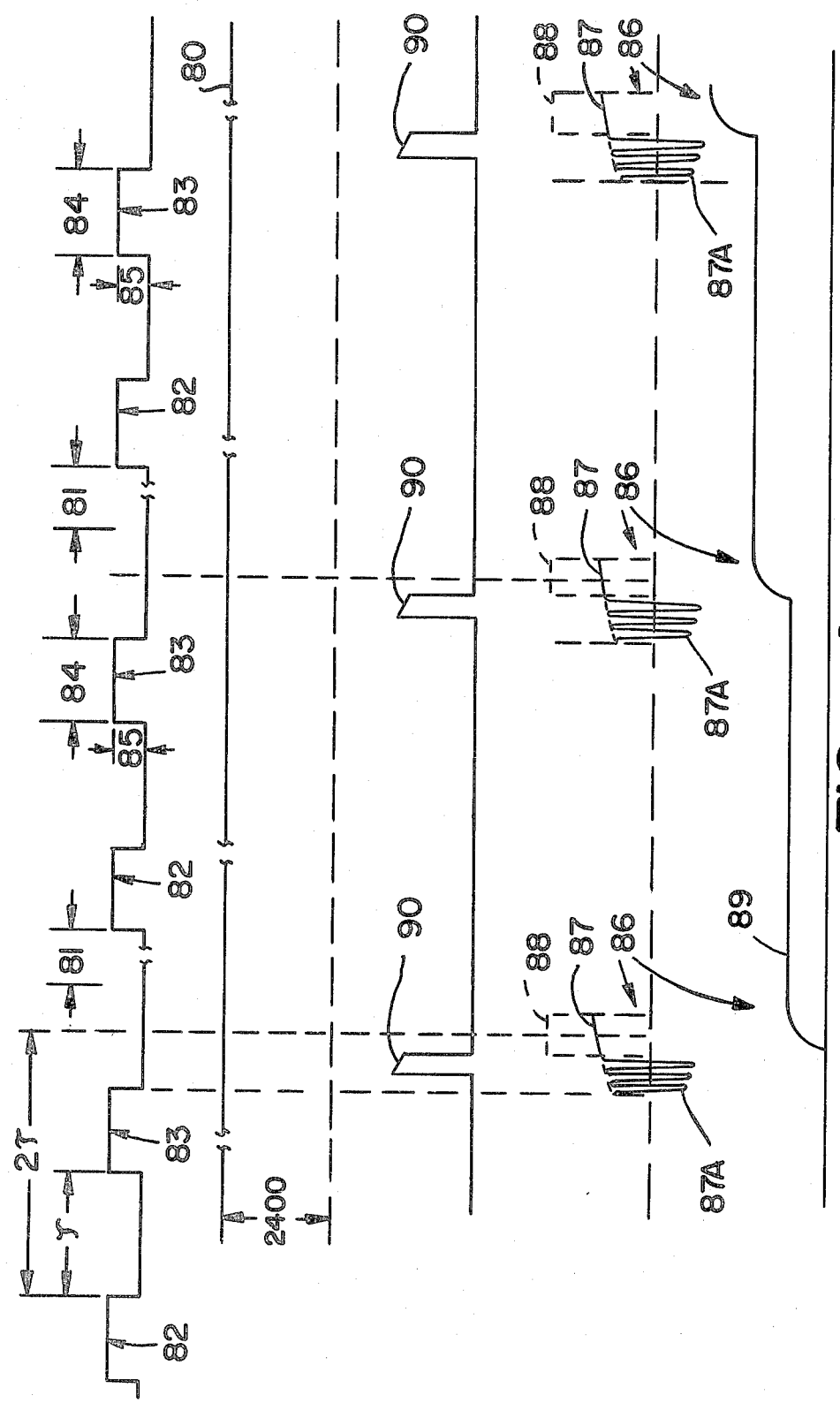
FIG_4

COMPUTER-CONTROLLED, PORTABLE SPIN ECHO NMR INSTRUMENT AND METHOD OF USE

CROSS-REFERENCES TO RELATED APPLICATIONS

My following applications, filed simultaneously herewith, are hereby incorporated herein by reference:

| Serial Number | Title |
| --- | --- |
| 255,978 | FOR "PORTABLE PULSED NMR INSTRUMENT AND METHOD OF USE" |
| 255,979 | FOR "COMPUTER-CONTROLLED, PORTABLE PULSED NMR INSTRUMENT AND METHOD OF USE" |
| 255,977 | FOR "COMPUTER-CONTROLLED, PORTABLE PULSED NMR INSTRUMENT AND METHOD OF USE WHEREIN THE TIMES OF RF INTERRROGATION ARE DISTRIBUTED OVER AT LEAST A CYCLE AT THE NUCLEAR MAGNETIZATION PRECESSIONAL FREQUENCY" |
| 255,975 | FOR "COMPUTER-CONTROLLED, PORTABLE PULSED NMR INSTRUMENT AND METHOD OF USE WHEREIN A DC MAGNETIC FIELD GRADIENT IS ARTIFICIALLY INTRODUCED" |

SCOPE OF THE INVENTION

This invention relates to a method and apparatus for determining physical properties of a porous medium using spin echo characteristics of precessing protons of entrained fluids, and more particularly to the swift indication of fluid-flow properties of ultrasmall samples of a particular type of such medium, viz., carbonates, as the fluid diffuses through the sample, by using a computer-controlled, small, portable NMR instrument. In another aspect, the present invention provides surprisingly quick NMR response data averaged over a series of sequentially applied, computer-controlled polarizing and spin echo response periods.

BACKGROUND OF THE INVENTION

In my prior applications, op. cit., I describe using a portable NMR instrument so that flow properties of rock samples can be accurately and swiftly measured, especially at remote field sites. The described principle of operation:spin-lattice relaxation times of fluids in chip samples can be accurately correlated to estimate flow properties of different rock samples. However, in a limited number of occasions related exclusively to testing of carbonate samples in the field, problems have arisen. (In this specification, the term "carbonate" includes limestones and dolostones; the former also relates to those types found to be formed by conventional chemical deposition including biological processes, as well as those limestones recipitated inorganically.)

While many other researchers have performed spin echo measurements as well as described in detail the effects of such measurements in relation to bounded media (See "SPIN ECHO OF SPINS DIFFUSING IN A BOUNDED MEDIUM," C. H. NEUMAN, PHYS. REV., Vol. 60, No. 11, June 1, 1974), none, as far as I am aware, have dealt with spin echo measurements in the context of entrained liquids diffusing in pores of carbonates, especially at on-site measurements of such samples; or have described results tying spin echo response, under these or similar types of circumstances, to permeability estimates of the samples.

SUMMARY OF THE INVENTION

In accordance with the present invention, fluid-flow properties of rock samples based on NMR response of the hydrogen nuclei of interstitial fluids within the pore space of such samples, can be swiftly achieved using a computer-controlled, portable NMR instrument in which diffusional effects of a brine-saturated carbonate sample are correlated to permeability estimates for the sample on a surprisingly accurate basis by observing normalized spin echo amplitudes as a function of an echo time interval in the presence of a DC magnetic field gradient. Result: Even though the instrument is placed at field sites away from the usual processing center, quick estimates of the permeability of the sample as during the drilling of a well, still results.

DETAILED DESCRIPTION OF THE DRAWINGS

FIG. 4 is a timing diagram illustrating the method of the present invention.

DESCRIPTIONS OF PREFERRED EMBODIMENTS

Figure 1:
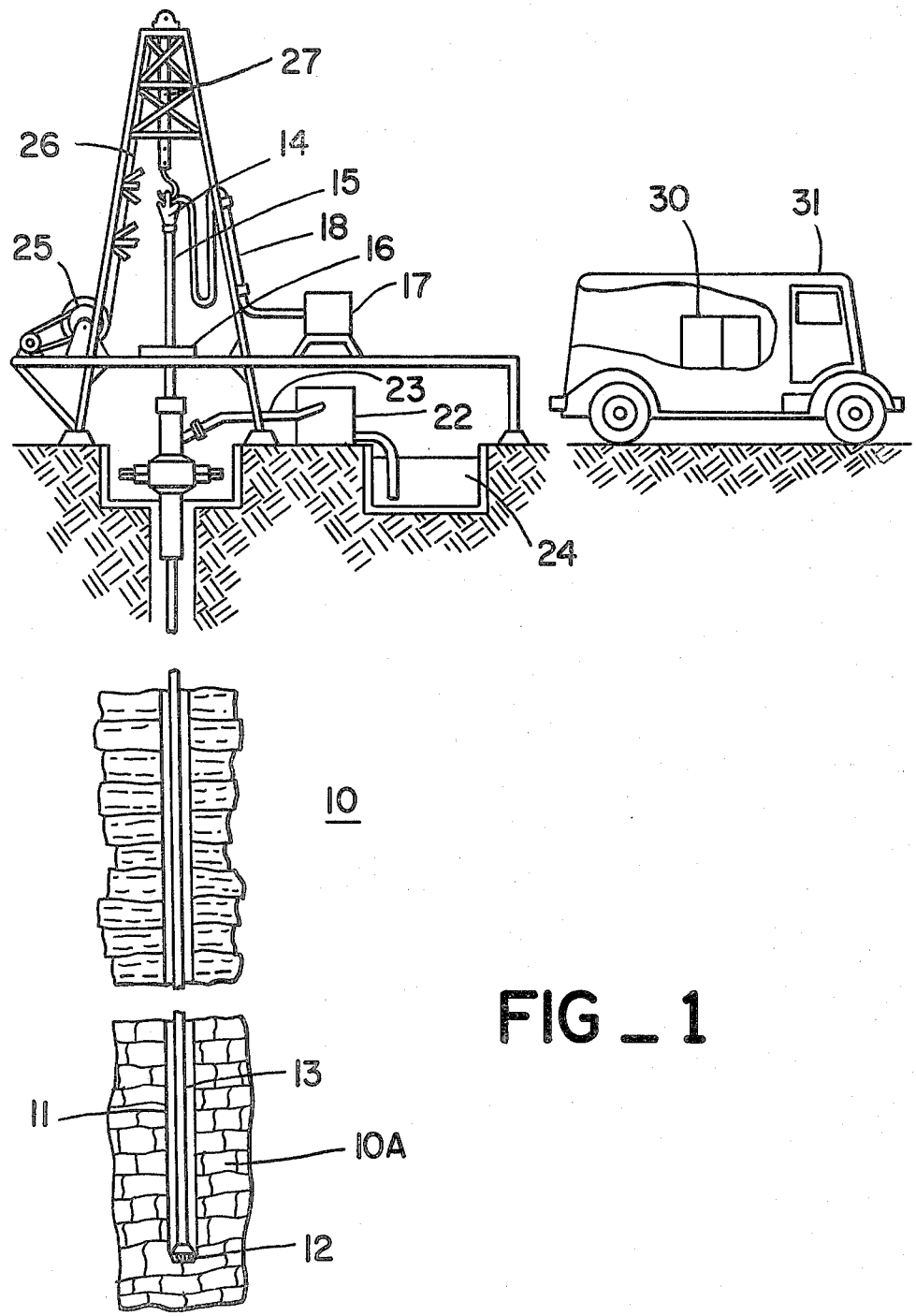
FIG. 1 illustrates a well drilling environment in which a computer-controlled spin echo NMR instrument and method of the present invention has use.

FIG. 1 depicts an environment in which the present invention is particularly useful, viz., in the measurement of fluid-producing potential of an earth formation such as earth formation 10 penetrated by wellbore 11, by determining its fluid-flow properties from NMR responses of chips associated with formation 10, including oil/gas containing limestone strata 10A. Such chips are produced by a drill bit 12 rotating within the wellbore 11. As shown, drill string 13 attaches to swivel 14 via Kelly bar 15 and rotary drill table 16. As the latter rotates, so does the drill bit 12. Result: Drill chips accummulate at the bottom of the wellbore 13.

In order to bring the rock chips from the limestone strata 10A adjacent the bottom of the wellbore 11 as well as to cool the bed 13, conventional drilling technology employs a drilling fluid 14. The fluid 14 continuously circulates in the wellbore 11 after its continuous introduction uphole at the surface of the formation 10.

Formation of the drilling fluid is at a mixer 17. When properly mixed, the fluid passes via line 18, swivel 14, and Kelly bar 15 and hence down drill string 13. After exiting from the drill string 13, the fluid cools the drill bit 12 as well as picks up rock chips at the bottom of the wellbore 11. It next travels up the annulus 20 (between the sidewall 21 of the wellbore 11 and the drill string 13) and exits uphole via line 23 to a Blooie box 22. After various levels of separation have occurred in the box 22, the fluid comes to rest at sump 24. Limestone chips previously entrained in the fluid 14 are quickly gathered, and after brief preparation as explained below, are analyzed at the well site by a pulsed NMR instrument 30 located within truck 31. The purpose of such analysis: to determine the fluid-producing potential, viz., permeability of the strata 10A in a quick and accurate manner.

Of importance is the annotation of the samples with the drilling depth of drill bit 12. Such information can be gathered from a shieve 25 attached to swivel 14 via cable 26 and support bar 27.

It should be apparent that quick evaluation of the fluid-producing potential of the strata 10A is exceedingly helpful to the field operator. For example, the operator is interested in quickly determining the following: if the samples have the necessary permeability to permit the fluid contents to flow towards possible producing wells; and whether or not the rock samples contained (in-situ) fluids of interest.

Then decisions can be made at the well site about, e.g., when to change from straight drilling to coring, when to run logs and when to make formation tests without the necessity of time-consuming trips formerly required when samples had to be taken or sent to distant laboratories for evaluation.

Figure 2:
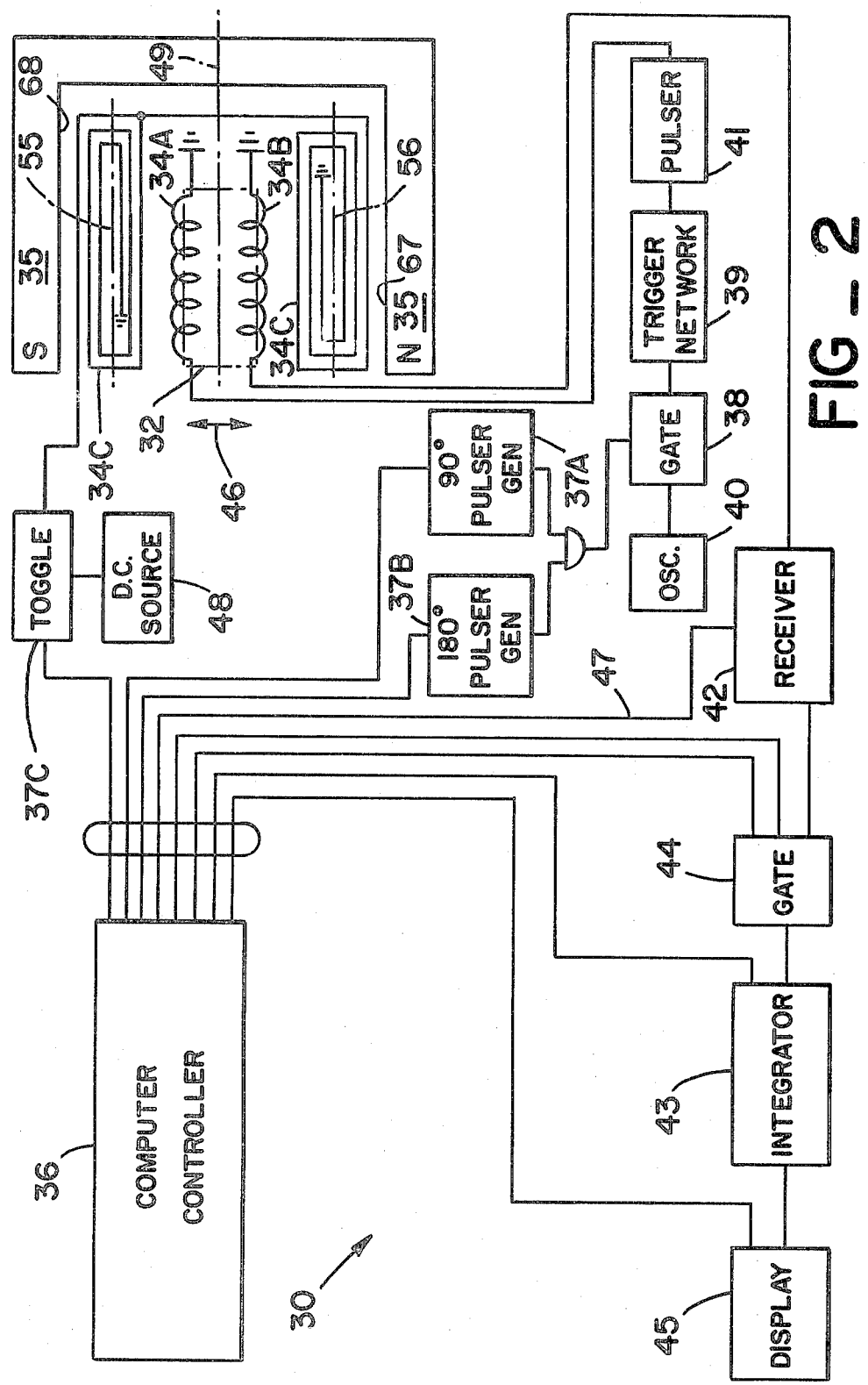
FIG. 2 illustrates in block form the apparatus of FIG. 1 for testing of ultrasmall samples of a porous earth formation in accordance with the present invention.

Attention is now directed to FIG. 2 in which computer-controlled pulsed NMR instrument 30 of the present invention is shown in more detail.

NMR instrument 30 incorporates many usual elements, e.g., a sample holder 32 (shown in phantom) into which the limestone chips are placed. Mechanically, the holder 32 is only symbolically illustrated since it is manditorily surrounded by co-extensive and colinear coils 34A and 34B at right angles to a DC field of magnet 35 and by elongated DC gradient coils 34C. (For didactic purposes, while coils 34C are shown with axes of symmetry 55 and 56 parallel to axis of symmetry 49 of holder 32, but offset to each side; in actual point of fact, such axes 55 and 56 are co-linear of and co-extensive with axis 49 of the holder 32, as are the axes of symmetry of coils 34A and 34B.)

Timed operations for the above are determined by computer-controller 36. The computer-controller 36 generates, inter alia, a series of digital control codes (signals). These codes are in bit form. Their flow pattern is via 90° and 180° pulse generators 37A and 37B, DC toggle 37C, gate network 38 and circuit 39. Its ultimate purpose: to control operations of associated circuits, including oscillator 40 and hence the triggering of pulser 41, as well as that of DC source 48 and hence the generating of a magnetic field gradient across the holder 32. The pulser 41 in effect "interrogates" the sample by generating a series of 90° and 180° magnetic pulses oscillating at the Larmor frequency for hydrogen nuclei in the DC field of magnet 35. Result: A series of spin echo responses associated with a succession of spin echo time frames (in the DC field of magnet 35) can be indicated via receiver 42 and associated circuitry.

At integrator 43, e.g., each nuclear magnetization signal is monitored and stored (via capacitor charging circuits) under direction of pulse codes provided by computer-controller 36, say at gate 44, as previously mentioned. The signals are ultimately displayed at display 45. These signals first undergo normalization. Hence, they represent only an average of echo response over a selected echo time interval (not the total amplitude for all intervals) between pairs of interrogation pulses.

Before discussing operations of instrument 30 of FIG. 2 in more detail, a review of key NMR terminology may be beneficial and is presented below.

Nuclear Magnetization, Dipole Moments Polarization and Relaxation

Hydrogen nuclei of entrained fluids of the rock samples within the holder 32 have magnetic dipole moments which produce magnetic fields somewhat like those of tiny magnets. Were it not for the fact that the moments are within the influence of the DC field of magnet 35, their fields would be randomly oriented and not produce an observable external magnetic field. But since they are subjected to such DC field, their associated magnetic fields become aligned with the DC field, say in direction of arrow 46. At the same time, a scrambling effect due to thermal motion is produced. It tends to prevent such alignment. Result: A slightly preferential alignment in the direction of the arrow 46 (called the "polarization") occurs. Note that the polarization is proportional to the strength of the DC field of magnet 35 that causes the alignment but inversely proportional to absolute temperature, the latter being a measure of thermal motion tended to scramble the system of nuclear magnetic moments.

The nuclear magnetization corresponds to the polarization, and produces a magnetic field which can be detected. Note that the nuclear magnetization does not immediately occur when the DC field is applied nor does it decay immediately when the DC field is removed or vice versa as when the holder 32 (with samples therein) is placed in or removed from the steady-state DC field of magnet 35. The process of the approach of the nuclear magnetization to its new equilibrium value when the magnetic field is changed is called "relaxation" and the corresponding times are called "relaxation times." But total signal decay in the present invention is not merely a function of proton relaxation but is also identifiable with diffusion effects. And, if the spin echo decay times were plotted on semi-logarithm paper, the initial decay in signal strength (with time) would be a straight line function (due to relaxation). Then, in accordance with the present invention, diffusion effects become surprisingly evident. Result: Analysis of change (from a normalized pattern of diffusion effects in the case of limestone) can be directly associated with pore dimensions, viz., pore entrance and exit channel dimensions, and thus provide a unique estimate of permeability of the surveyed sample.

Precession

In addition to being little magnets, fluid nuclei within the holder 32, are also like little gyroscopes, and the applied DC magnetic field of the magnet 35 will twist them just as gravity twists a spinning top. Result: The nuclei precess. That is, they precess unless they are aligned with the DC magnetic field just as the toy top precesses so long as it is not aligned with the earth's field of gravity.

Detection of Precession

A precessing nuclear magnetization produces a rotating magnetic field which in turn generates electric signals which can be detected. Precessional frequencies are directly proportional to the strength of the twist causing the precession, that is to say, it is directly proportional to the strength of applied DC magnetic field of the magnet 35, and the precessional frequency is 4.2577 kilohertz per gauss of applied DC field for hydrogen nuclei of interest.

Conditions for Precession

Two things must be present to obtain a precessing nuclear magnetization: First, the magnetization must be produced, by the placement of holder 32 (with sample) in the DC magnetic field provided by magnet 35 for an appropriate length of time. Second, the magnetization and magnetic DC field must somehow be made not parallel to each other as by (i) manipulating the magnetic fields to reorient the nuclear magnetization, or (ii) reorienting the magnetic fields so that the magnetization is subjected to a magnetic field in a new direction.

In nuclear magnetism logging, the concept set forth in item (ii) is used, i.e., proton precession is caused to take place in the earth's field after the nuclear magnetization has been generated in a direction in the borehole perpendicular to the earth's field; when the polarizing field is cut off, the magnetization is left to precess about the earth's field.

In pulsed NMR technology, the opposite is done. The magnetization is first generated by means of the permanent magnet 35 in the direction of arrow 46 and then it is reoriented by means of briefly applied radio-frequency magnetic fields at right angles to the DC field via coil 34A, and then it is allowed to precess about the DC field.

Conditions for RF Reorientation of the Magnetization

A convenient way to visualize reorientation of the nuclear magnetization associated with the hydrogen nuclei within the holder 32 is via the analogous use of a rotating frame of reference.

It can be shown mathematically and is plausible intuitively that assuming a reference frame rotating with the same frequency as that of the RF magnetic field applied via coil 34A to cause precession, then in the rotating frame the reorientation of the nuclear magnetization occurs as if certain magnetic fields were cancelled. If additional fields are present (other than those apparently cancelled), then it may be easy to visualize their effect.

As a simple example, assume that a reference frame rotates at exactly the precessional frequency of the nuclear magnetization in the DC field of the permanent magnet 35. Then in the rotating frame the magnetization is apparently not subject to the action of any magnetic field at all. As the oscillating RF field (via coil 34A) is applied exactly at the precessional frequency of the hydrogen nuclei (again, being exactly the frequency with which the reference frame rotates), the oscillating RF field, in effect, consists of two rotating fields. Each has half the amplitude of the oscillating field and rotates in opposite directions. Result: Their components perpendicular to the oscillating field cancel, while their components parallel to the oscillating field add so that each equal to half the oscillating field. One of these rotating fields appears to stand still, that is, the one that is rotating the same way as is the reference frame, and causes a steady precession of the nuclear magnetization about it. But, the one rotating the other way now appears to rotate twice as fast, and alternates directions so rapidly that is has no effect.

Quantitative Example

Consider that 20 gauss is the strength of the RF field applied via the coil 34A at right angles to the DC field of magnet 35. Thus, the strength of a rotating component is 10 gauss. Consider also that the DC field of the magnet 35 (about 2400 gauss) is absent in the rotating frame of reference leaving what appears to be a static field of 10 gauss (plus another 10 gauss field rotating so fast it is ineffectual), acting in direction of arrow 46. The nuclear magnetization precesses about the 10 gauss field (turns about this field as an axis) at a frequency of 42577 hertz (10 gauss $\times$ 4257.7 hertz per gauss) corresponding to a period of 23.5 microseconds.

If the RF field is applied for 23.5 microseconds, the magnetization would have precessed one full cycle, and would be oriented just as it was before application of the RF field by the coil 34A. However, suppose the RF pulse of the coil 34A is supplied just under 6 microseconds. Then, the magnetization initially parallel to the DC field, precesses about a quarter cycle (90° in the rotating frame end), leaving the magnetization at right angles to the strong DC field. Since it is at right angles when the RF pulse terminates, conditions necessary for magnetization precession exists. Result: An NMR response is established.

Spin Echo Precession

E. L. Hahn's famous experiment in spin echo enhancement (PHY. REV. 80,580, 1950), showed that detection of the precessing nuclear magnetization could occur using a 180° RF pulse after application of the conventional 90° pulse. He taught that phase distortion could be overcome by his technique. He reasoned that such phase distortion was primarily introduced by the fact that individual protons rotated at differing rates, with some protons greatly outdistancing their neighbors in the same manner as race horses change positions during a race. His solution: Gain a second look at the "in-phase" protons by interchanging positions of "winning" and "losing" protons. In the above horse-race analogy, the fast horse, who in the middle of the race was put in the position of the slow horse, would be even with the slow horse, who in the middle of the race was put in the position of the fast horse, at the end of the race. Another way of saying this is that a "handicap" could be determined in a first race; then, if the horses are positioned according to their handicaps and they both maintain their own speeds, they will run a second race in a dead heat. The resulting signal could be detected, say at a predetermined spin echo detection time, using a coil akin to coil 34B of the present invention.

Magnetic Gradients

Gradient coil construction techniques, including those related to rectangular construction in the area of measurements via nuclear resonance, are well known [See REV. SCI. INSTR. 36 1087 (1965) and J. PHYS. E. SCIENTIFIC INSTR. 6 899 (1973)]. As shown in FIG. 5, note that coils 34C include long sides 28A parallel to the axis of symmetry 49 of the holder 32, as well as shorter sides 28B at right angles thereto. Electrically, two line currents (with appropriate return paths) are sufficient to power the coils 34C. Source of energy: battery 50. The result is that a properly proportioned magnetic field can be provided across the holder 32 to attenuated spin echoes in a manner that allows their amplitudes to be better correlated to permeability estimates of the associated sample.

Figure 3:
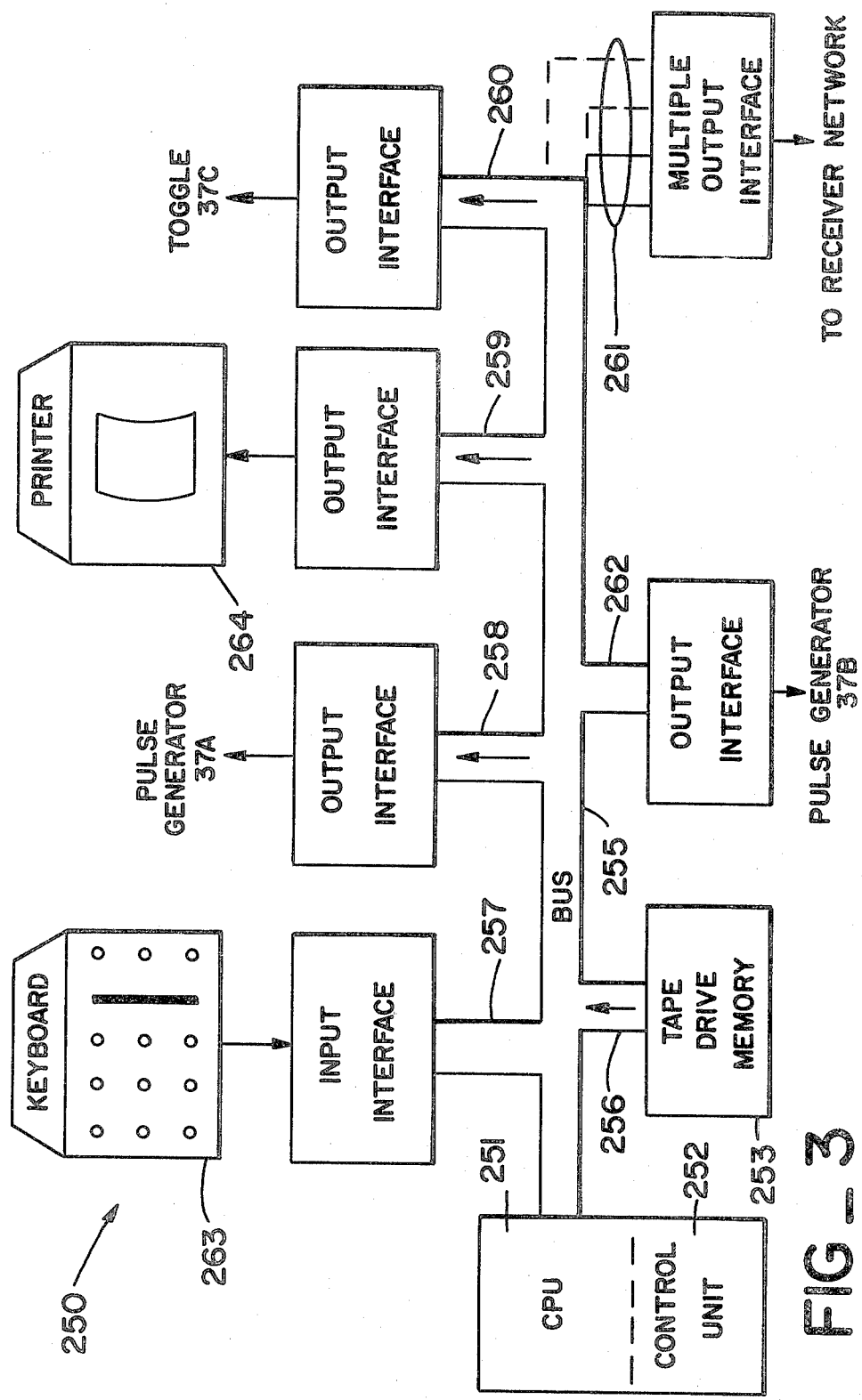
FIG. 3 is a detail of a further aspect of the apparatus of FIG. 1.

FIG. 3 illustrates operation of computer-controller 36 in still more detail. However, generic elements thereof are set forth for didactic purposes only, to illustrate certain aspects of the method of the present invention. While many computing systems are available to carry out the process of the invention, to best illustrate operations at the lowest cost per instruction, microcomputing system 250 is shown. In general, the microcomputing system 250 can be implemented on hardware provided by several different manufacturers, but a microcomputer system chosen to best teach the method aspects of the invention is provided by the Intel Corporation, Cupertino, California.

System 250 includes a CPU 251 controlled by a control unit 252. Tape drive memory 253 connects to the CPU 251 and bus 255 through port 256. Memory 253 stores instructions. The instructions direct the activities of the CPU 251. Result: At least first, second, third and fourth series of pulse codes (in bit form) are generated and sequentially addressed via particular ports 257-262 in the manner previously described with reference to FIG. 2.

In general, at least first and second sets of codes are associated with the generation of the interrogating 90° and 180° RF pulses. Such codes are based on repetition rate, amplitude (and/or duration and frequency) of the pulses and are introduced to generators 37A and 37B via output ports 258 and 262, respectively.

Another set of control code is introduced to toggle 37C via output port 260 to permit current flow—on a pulsed basis—to gradient coils 34C to be confined to the time intervals between the RF pulses and the echo times of the precessing protons. In that way, pulses and echo detection are minimized.

Still another set of code relates to detection of the resulting spin echo signals. Of particular importance in this regard is the high degree of control they exercise over time windows 88 of FIG. 4. Key to operation: The fact that such series of control codes exiting from bus 255 via ports 261, can be easily used to divide the time domain associated with the spin echo window into a plurality of sub-intervals. So it is a simple matter to have each window 88 open a selected number of sub-intervals after cessation of each pair of 90° and 180° interrogation pulses as well as close, on command, after a second number of intervals has passed. (Also, it is evident that detection of spin echo by such last set of code, can also control the generation of the DC gradient field, if desired, decreasing the number of control codes required for operation.)

Operations of the control circuitry 252 are conventional in this regard. After an instruction is fetched and decoded, the control circuitry 252 issues the appropriate control codes in bit form for initiating the proper processing action, as described above. The control circuitry 252 is capable of responding in several different forms, such as by interrupt or wait requests; by signals generated by keyboard 263; or to control external devices such as printer 264. But for the task at hand, such functions are unimportant and not needed but could possibly be brought into play for modification purposes, if desired, at a later time.

Usually, the CPU 251 includes an array of registers tied to an ALU through an internal data bus under control of control unit 252. The registers are temporary storage areas for issuing control signals corresponding to logic contained in the program listing within memory 253. The program in memory 253 is operated upon in a sequential manner except when the instructions call for special commands such as "jump" (or "call") instructions, as well known in the microcomputer control art.

Having now described the operations of CPU 251, the full set of instructions is self-evident. Note that the plurality of control codes must directly maintain the integrity of the polarizing period and spin echo detection intervals for the correct number of times per measuring cycle.

For example, assume 20 spin echo responses are to be stacked over a selected echo window, and say the polarizing period is constant, say a few hundred milliseconds. Since the 90° and 180° RF magnetic pulse widths are essentially constant, the time span between any one pair of 90° and 180° RF pulses and its neighboring pair would be equal to the aforementioned few hundred milliseconds. Assume also that the mean echo time of each echo response window increments about 10 times each measuring cycle. Thus, the computer-controller 36 would essentially track two variables: (1) spin time increments about a series of mean spin echo times, usually occurring at $2\tau$ after cessation of the 90° pulse of each pair of pulses, and (2) the iterative number of spin amplitudes stacked within the maximum number allowed (i.e., 20) per measuring cycle. Result: Spin echo responses as a function of different $2\tau$ mean echo times, can be easily stacked for the prerequisite number of times before the cycle iterates. For example, when the counts of a controlling counter (of the computer-controller 36) match a count setting at a particular operational level, a supervising register (similarly located) decrements its pre-existing count setting by ONE; resets the controlling counter to zero while sequentially activating the generators 37A and 37B and hence, gate 38. Result: Pulser 41 is activated to provide a correct spin echo environment for response. Just prior in time, toggle 37C is activated, permitting DC current to flow to coils 34C so as to provide the prerequisite field gradient across the sample, while the receiver 42 is activated to detect spin echo response out a selected $2\tau$ time window. The computer-controller 36 then iterates its operations code to allow the process to be repeated and then to be re-repeated until the decremented count at the supervising register has reached a zero count value. Then at that occurrence (at the occurrence of the 20-in-20th stacking increment), a new supervising register count can be triggered to initiate operations of the next level $2\tau$ spin echo window whereby the responses of the samples associated with a different $2\tau$ spin times are rapidly provided. The process continues unti the lowest level of the cycle is reached at which time operations terminate.

It should be repeated that the sample is interrogated via activation of the transmitter-pulser 41. Result: The built-up magnetization is reoriented, allowing the protons to precess about an axis parallel to arrow 46 and after being inverted via the 180° interrogation pulse to be detected via coil 34B and receiver 42 connected to coil 34B. Since the receiver 42 preferably includes diode rectification subcircuitry, the receiver output is the envelope of the positive peaks of the precessional signals, not their absolute values. Note in this regard that coils 34A and 34B are co-extensive and hence interactive. When cylindrical coil 34A radiates RF pulses, such pulses are also detectable at coil 34B and receiver 42. Hence, a need exist to disable receiver 42 for selected sub-intervals of time via line 47 connected to the computer-controller 36 which cooperatively function to "blank off" the receiver 42 as the transmitter-pulser 41 is activated.

Further refinements in the timing of operations can also be provided by the computer-controller 36 at, say gate 44 which provides a synchronizing function. Result: generation of a particular and repetitive $2\tau$ time window over which the spin amplitude per mean echo time can be measured. Although the time frame of the window is constant within the measuring cycle, it can be incremented to a new $2\tau$ mean value as required; e.g., the computer-controller 36 can accurately control the different $\tau$ time intervals formed between the cessation of each of the 90° pulse and the up-tick of each 180° pulse to thereby also fix the different sets of $2\tau$ mean values so that the time window opens a preselected time increment after the transmitter-pulser 41 has been activated, as well as closes at the appropriate time, say as measured from zero-crossing of the same pulser output. Result: The spin echo responses build-up over the time window can be properly gated to an integrator 43 where amplitude accummulation over the repeated measuring cycle occurs. That is to say, the amplitude per window increment is accummulated at the integrator 43 for the entire 20 measuring periods. Then as dictated by a change in operational level within the computer-controller 36, the integrator 43 is reset to zero, and a new measuring cycle begins.

Display 45 continuously monitors the integrated output of the integrator 43 and visually displays the results. The display 45 can be a digital volt meter (DVM), so as in effect, the integrated response from integrator 43 is normalized to an average value over the 20 NMR polarizing periods that the NMR response is monitored.

Note in FIG. 2 that the width of the pole faces 67 and 68 extend beyond the holder 32. Also note that the volume of holder 32 of the present invention is very small ()×the diameter×the length of the sample) compared to the inhomogeneity gradient D of the DC field. Assume also that the present invention can provide an RF field larger in magnitude compared to the over- and under-cancelled field components. That is, the amplitude of the RF pulse in FIG. 4 is maintained at a peak value that is substantially greater than the variation in the DC field over the sample volume. Result: The spin echo responses are essentially uneffected by inhomogeneity.

FIG. 4 illustrates operations in signal waveform fashion.

As shown, the numeral 80 identifies the signal waveform of the DC magnetic field as provided by magnet 35. Note that the field is continuously applied to the sample over a measurable polarizing interval 81 (for providing magnetization build-up to the hydrogen nuclei). Note further that the interval 81 terminates with the onset of 90° RF pulses 82. Pulse 82, after a time interval $\tau$ is followed by the 180° RF pulses 83 generated by pulser 41. Each pulse 82, 83 oscillates at the Larmor frequency of hydrogen nuclei and randomly begins within a particular cycle based on random start point, as previously stated. Each polarizing interval 81 provides for build-up of the magnetization in the manner previously described so that relaxation characteristics can be established.

In this regard, width 84 and amplitude 85 of each pulse 82, 83 must be sufficient to achieve proper reorientation of the magnetization as previously described. In this regard, the product of amplitude and pulse width should be equal to approximately $\pi/\gamma \times Z$ where $\gamma$ is the magnetogyric ratio and Z is a number between 0.1 and 20 but preferably about ½ for pulse 82 and about 1.0 for pulse 83.

Of course, the purpose of the RF pulses is to serialize operations whereby a plurality of spin echo responses (generally indicated at 86) at $2\tau$ mean time values can be indicated (after the establishment and termination of the magnetic gradient fields 90 across the sample). Responses 86 are first seen as signals 87 associated with receiver 42, and next seen as signals 89 associated with integrator 43, and can be ultimately indicated as an accumulative digital display, normalized as previously indicated at display 45.

Signals 89 result from positive rectification of the precessional signals 87 over spin window 88. Signals 87, of course, represent the envelope that intersects the positive peaks of the signal 87A as a function of time and is indicative of the absolute magnetization strength. Signals 89 thus can represent feedback operations of an operational amplifier incrementally charging a capacitor to a peak amount proportional to the integrated rectified voltage produced during signal gates at the receiver 42. Only after the repetitive measuring cycle has been completed, say 20 repetitions, does the capacitor become discharged.

Display 45 preferably is a digital volt meter (DVM) and includes a 7-segment decoder-driver in series with the plurality of LED's. It provides a digital readout of the signal 89 as a function of time. The display is preferred normalized by dividing the total display count by the number of measuring repetitions. The final normalized count can be held for display as long as required, usually until a reset signal (see FIG. 2) is received from the computer-controller 36 to initiate a new cycle. During that period, a camera (not shown) can be used to record the display, if desired.

One skilled in the art should realize that while as little as two separate responses can define a signal decay curve of spin echo responses for the hydrogen nuclei undergoing examination. About ten such curve points are desirable. What is usually provided is a quantity which is logarithmically proportional to initially relaxation and later to the rate of diffusion of protons at different finite times. I.e., if total spin echo decay were plotted on semi-logarithm paper, the initial decay in signal strength (with $\tau$ time) would be a straight line function. Then diffusion effects would become evident. And, the change in diffusion (from a normalizing pattern in the case of limestone) is directly associated with pore dimensions, viz., so as to provide a unique estimate of permeability of the carbonate sample.

Sample Preparation

Rock samples obtained in the manner depicted in FIG. 1 or mechanically extracted from a core cut from the earth during drilling, are cleansed as discussed below.

If the samples have no visible oil traces in their outer surfaces, simple immersion in a 1% NaCl aqueous solution is usually sufficient. Removal of air (from within their pores) may be helpful, as done by a conventional air evacuation system. Cleansed samples (after pat drying) are inserted to a depth of about 6 mm within coil 34A. Sample volume is a little over 0.3 cubic cm. However, since the chips are irregular in shape, they may occupy only about half the space.

If the samples have some oil at their outer surfaces (a common occurrence if they come from a formation penetrated by a well whose circulating fluid was an oil-base drilling mud or if the sample is from an oil-containing zone), cleaning can be a bit more difficult. But applying conventional dry cleaning fluids to the oil "stains" seems to solve the problem. Then saline immersion, followed by air evacuation and pat drying, provide adequately cleansed samples for testing in accordance with the present invention.

Conclusion

In accordance with the present invention, a series of spin echo measurements provides indications of permeability of the associated limestone samples. Although analysis is not simple, the present invention provides surprisingly accurate estimates of permeability under such circumstances based on change in diffusion effects.

For a given porosity and free-fluid content, the greater the interference with diffusion effects as measured by spin echo responses within the sample, the smaller its volume-to-surface ratio, the smaller its flow channels and hence, the smaller its permeability. Thus, good echoes at substantial times indicate diffusion is being interfered with by small pore channels, which are also associated with low permeability. Good echoes at substantial times indicate low permeability, and bad echoes indicate good permeability. Permeability expressions, based on proton relaxation and diffusion effects, are then developed. Of course, if sample cores are available, the equations can be further altered in light of data observable from testing of such cores. In that way, new permeability formulas can be especially developed for specific geologic situations.

Porosity is the ratio of pore volume to total rock volume including pore volume, or $$\text{porosity} = \phi = \frac{\text{pore volume}}{\text{pore volume} + \text{solid volume}} \quad (1)$$

and can be used in the permeability estimate as is well known to those skilled in the art; see my prior applications, op. cit.

All specific embodiments of the invention have been described in detail, and it should be understood that the invention is not limited thereto as many variations will be readily apparent to those skilled in the art. For example, while the embodiments described above emphasize use with carbonate samples, the present invention could also be employed to determine the fluid-flow properties of the more conventional rock types, such as sandstones, if desired. Thus, the invention is to be given the broadest possible interpretation within the terms of the following claims.

I claim:

1. Automatic apparatus for determining permeability properties of a carbonate sample based on spin echo diffusion response of hydrogen nuclei of interstitial fluids within pore spaces of said samples comprising:
   (a) magnet means for producing a DC magnetic field acting on said carbonate sample, said magnetic field having an intensity of at least 1 kilogauss and an inhomogeneity of at least D gauss to aid providing nuclear magnetization build-ups associated with said interstitial fluids within said sample as a function of time;
   (b) RF coil means acting at right angles to said DC magnetic field;
   (c) transmitter means including digital control means for generating first and second series of digital control codes associated with 90° and 180° RF magnetic pulses of selected frequency, amplitude and duration, connected to said RF coil means to produce a series of pairs of 90° and 180° RF magnetic pulses for interrogating said sample to obtain spin echo diffusional responses of said fluid within said sample, said amplitude of each pulse being controlled to be at least greater than the variation D in said DC field over said sample;
   (d) gradient DC coil means connected to generating a series of gradient DC fields across said sample as a function of a third series of control pulses; and
   (e) receiver means connected to said digital control means and to said RF coil means for detecting as a function of a fourth series of digital control code associated with a plurality of time windows, output signals proportional to said spin echo diffusional responses of said interstitial fluids whereby said responses can be meaningfully related to permeability of said sample.

2. The apparatus of claim 1 wherein said carbonate sample is limestone.

3. The apparatus of claim 1 wherein said first and second series of codes generated by said digital control means change to cause the pulse repetition rate of said transmitter means associated with said 90° and 180° interrogation pulses to also change whereby time intervals between the cessation of the 90° pulse and the start of the 180° pulse of each pair of interrogation pulses are different, and permeability of the sample determinable.

4. The apparatus of claim 3 wherein said receiver means is connected to an integrator circuit and wherein said series of control codes generated by said control means normalize said spin echo responses over a plurality of said time windows to attain first and second statistically-improved signals representing spin echo diffusion effects for different time intervals between the pairs of interrogation pulses.

5. The apparatus of claim 3 wherein said integrator circuit integrates said responses in accordance with said series of control code over each of said plurality of time windows to obtain at least an improved signal representing the normalized spin echoes of nuclear magnetization in said DC magnetic field between application of any pair of 90° and 180° RF magnetic interrogation pulses.

6. The apparatus of claim 5 wherein said integrator circuit is connected to a display means.

7. A method for swiftly determining permeability of a sample based on spin echo diffusion resonance (NMR) response of hydrogen nuclei of interstitial fluids within said sample comprising:
   (a) storing digital control codes associated with (i) a series of interrogation 90° and 180° RF magnetic pulses of selected frequency, duration and magnitude; (ii) a plurality of spin echo time windows for detection of a plurality of spin echo diffusion response signals; and (iii) a series of DC gradient field control pulses for controlling spin echo attenuation;

(b) placing the sample in a steady DC magnetic field having a strength of at least 1 kilogauss and an inhomogeneity of at least D gauss to aid providing a series of nuclear magnetization build-ups associated with said interstitial fluids;

(c) under control of said control codes, subjecting said sample to interrogation by said at least pairs of 90° and 180° RF magnetic field pulses defined by a time interval $\tau$ and each having selected frequency, duration and magnitude values to obtain a plurality of spin echo diffusion responses of said fluid within said sample, the magnitude of each of said pulses being greater than the variation D in strength in said DC field over said sample; and (d) automatically detecting after interrogation in accordance with said control codes, said plurality of spin echo diffusion responses indicative of sample permeability, each of said spin echo responses occurring individually between pairs of 90° and 180° pulses.

8. Method of claim 7 in which said series of codes cause the receiver response to change between at least two selected spin echo mean time values, measured from the cessation of said 90° pulse, whereby permeability of said sample can be determined.

9. The method of claim 8 in which the two different spin echo mean series are equal to $2\tau_1$, and $2\tau_2$, respectively, and $\tau_1 \neq \tau_2$.

10. A method for swiftly determining permeability based on spin echo responses of hydrogen nuclei of interstitial fluid within a sample, comprising:

(a) storing digital control codes associated with (i) control of a series of 90° and 180° interrogation RF magnetic pulses of selected frequency duration and magnitude and (ii) generation of a plurality of spin echo time windows for detection of a plurality of spin echo diffusion responses;

(b) placing the sample in a steady DC magnetic field having a strength of at least 1 kilogauss and an inhomogeneity of about D gauss to aid in providing a series of nuclear magnetizations associated with said sample, said each nuclear magnetization having a preferential alignment parallel to said DC magnetic field;

(c) subjecting said sample on a sequential basis in accordance with said control codes, to said series of RF magnetic pulses to cause reorientation of said magnetization to preferred alignments offset from said DC field, said amplitude of said interrogation pulses being greater than the variation D in strength of said DC field over said sample;

(d) automatically detecting after interrogation, in accordance with said control codes, spin echo diffusion responses associated with spin echo precession of said magnetization build-ups about axes substantially parallel of said DC field magnetic field within said plurality of time windows, each of said windows occurring within an interval after cessation of any pair of said 90° and 180° interrogation pulses and within subintervals beginning at a fixed delay time after cessation of each 180° interrogation pulse; and (e) automatically repeating steps (c) through (d) in accordance with different digital control codes whereby a different predetermined time interval between said pairs of interrogation pulses is used to obtain at least a second statistically-improved spin echo signal, whereby permeability of said sample can be indicated.

11. Method of claim 10 in which said control codes of step (c) are characterized by having the product of pulse width and amplitude of each RF pulse interrogating said sample being equal to $\pi/\gamma \times Z$ where $\gamma$ is the magnetogyric ratio and Z is any number.

12. The method of claim 11 in which Z is between 0.1 and 20.

13. The method of claim 11 in which Z is between about 0.2 and 2.

14. Method of claim 10 in which the steps involving detecting spin echo responses in accordance with said control codes for two different series and sub-series of time intervals, is followed by the step of analyzing relative rates of spin echo diffusion as a function of time to thereby indicate permeability of said sample.

15. Method of claim 10 in which the sample is a carbonate.

16. Method of claim 10 in which the sample is a limestone.

17. Method of claim 10 in which the sample is a sandstone.

* * * * *